(12) United States Patent
Fang (10) Patent No.: US 9,559,180 B2
(45) Date of Patent: Jan. 31, 2017

(54) SEMICONDUCTOR DEVICE AND METHOD OF MANUFACTURING THE SAME

(71) Applicant: SEMICONDUCTOR MANUFACTURING INTERNATIONAL (SHANGHAI) CORPORATION, Shanghai (CN)

(72) Inventor: Lei Fang, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 0 days.

(21) Appl. No.: 15/188,063

(22) Filed: Jun. 21, 2016

(65) Prior Publication Data
US 2016/0300918 A1 Oct. 13, 2016

Related U.S. Application Data

(62) Division of application No. 14/568,819, filed on Dec. 12, 2014, now Pat. No. 9,419,104.

(30) Foreign Application Priority Data

May 27, 2014 (CN) .......................... 2014 1 0228115

(51) Int. Cl.
| | | |
|---|---|---|
| H01L 29/66 | (2006.01) | |
| H01L 21/339 | (2006.01) | |
| H01L 29/423 | (2006.01) | |
| H01L 29/06 | (2006.01) | |
| H01L 29/417 | (2006.01) | |
| H01L 29/78 | (2006.01) | |

(52) U.S. Cl.
CPC ....... *H01L 29/4236* (2013.01); *H01L 29/0653* (2013.01); *H01L 29/41758* (2013.01); *H01L 29/7827* (2013.01)

(58) Field of Classification Search
CPC .................................................. H01L 29/66704
USPC .......... 438/295–301, 555; 257/221, 341, 401
See application file for complete search history.

(56) References Cited

U.S. PATENT DOCUMENTS

| | | | | |
|---|---|---|---|---|
| 6,620,692 B2* | 9/2003 | Scott | ................... | H01L 29/7816 438/257 |
| 7,091,535 B2* | 8/2006 | Tsai | ................... | H01L 29/1045 257/285 |
| 9,419,104 B2* | 8/2016 | Fang | ................... | H01L 29/7825 438/295 |
| 2008/0246080 A1* | 10/2008 | Ito | ....................... | H01L 29/0865 257/328 |
| 2015/0035053 A1 | 2/2015 | Singh | | |

* cited by examiner

*Primary Examiner* — Calvin Lee
(74) *Attorney, Agent, or Firm* — Innovation Counsel LLP (57) ABSTRACT

A semiconductor device is provided. The semiconductor device includes a semiconductor substrate, a P-well and an N-well disposed in the semiconductor substrate, a source disposed in the N-well and a drain disposed in the P-well, a shallow trench isolation (STI) structure disposed in the P-well, a gate structure disposed on the semiconductor substrate, wherein a portion of the gate structure extends into the semiconductor substrate and is disposed in a location corresponding to the STI structure.

9 Claims, 6 Drawing Sheets

SEMICONDUCTOR DEVICE AND METHOD OF MANUFACTURING THE SAME

CROSS-REFERENCE TO RELATED APPLICATION

This is a divisional of U.S. patent application Ser. No. 14/568,819, filed on Dec. 12, 2014, now U.S. Pat. No. 9,419,104 issued Aug. 16, 2016, which application claims priority to Chinese Patent Application No. 201410228115.6 filed on May 27, 2014, the disclosure of which is incorporated herein by reference in its entirety.

BACKGROUND

Technical Field

The present disclosure relates to the field of semiconductor technology, and more particularly to a semiconductor device and method of manufacturing the same.

Description of the Related Art

In the field of semiconductor technology, laterally diffused metal oxide semiconductor (LDMOS) can be used in many applications. For example, LDMOS is typically an important component in power devices.

However, in high power device applications, LDMOS is often unable to meet both breakdown voltage (BV) and device performance requirements. As a result, some of the BV and device performance requirements may have to be compromised when using the LDMOS in high power device applications.

SUMMARY

The present disclosure addresses at least the above deficiencies in the prior art, by disclosing a LDMOS that has a high breakdown voltage and improved device performance requirements.

According to an embodiment of the inventive concept, a semiconductor device is provided. The semiconductor device includes: a semiconductor substrate; a P-well and an N-well disposed in the semiconductor substrate; a source disposed in the N-well and a drain disposed in the P-well; a shallow trench isolation (STI) structure disposed in the P-well; a gate structure disposed on the semiconductor substrate, wherein a portion of the gate structure extends into the semiconductor substrate and is disposed in a location corresponding to the STI structure.

In one embodiment, the portion of the gate structure extending into the semiconductor substrate may be disposed directly above the STI structure.

In one embodiment, a thickness of the portion of the gate structure extending into the semiconductor substrate may range from about half to a full thickness of the STI structure.

In one embodiment, the portion of the gate structure extending into the semiconductor substrate may be disposed in a recess in the STI structure.

In one embodiment, the recess may expose at least one inner sidewall of the P-well.

In one embodiment, the recess may expose two inner opposite sidewalls of the P-well.

In one embodiment, the recess may be disposed within the STI structure without exposing any inner sidewall of the P-well.

In one embodiment, the semiconductor device may further include spacers disposed on opposite sides of the gate structure.

In one embodiment, the semiconductor device may further include an electrode disposed in the N-well.

According to another embodiment of the inventive concept, a method of manufacturing a semiconductor device is provided. The method includes: providing a semiconductor substrate; forming a shallow trench isolation (STI) structure in the semiconductor substrate, wherein the STI structure is disposed in a location corresponding to where a P-well is to be formed; performing ion implantation to form the P-well and an N-well in the semiconductor substrate, wherein the P-well is formed surrounding side and bottom portions of the STI structure; forming a recess in the STI structure; forming a gate structure on the semiconductor substrate, wherein a portion of the gate structure extends into the recess; and performing ion implantation to form a source in the N-well and a drain in the P-well.

In one embodiment, forming the recess may further include: forming the recess by etching a portion of the STI structure, the portion of the STI structure having a predetermined thickness.

In one embodiment, the predetermined thickness may range from about one-third to about half of a thickness of the un-etched STI structure.

In one embodiment, the method may include, after forming the gate structure and prior to performing the ion implantation: forming spacers on opposite sides of the gate structure.

In one embodiment, the method may further include performing ion implantation to form an electrode in the N-well.

In one embodiment, the recess may expose at least one inner sidewall of the P-well.

In one embodiment, the recess may expose two inner opposite sidewalls of the P-well.

In one embodiment, the recess may be disposed within the STI structure without exposing any inner sidewall of the P-well.

BRIEF DESCRIPTION OF THE DRAWINGS

The accompanying drawings, which are incorporated herein and constitute a part of the specification, illustrate different embodiments of the inventive concept and, together with the detailed description, serve to describe more clearly the inventive concept.

It is noted that in the accompanying drawings, for convenience of description, the dimensions of the components shown may not be drawn to scale. Also, same or similar reference numbers between different drawings represent the same or similar components.

FIGS. 3C-1 and 3C-2 depict schematic views of a semiconductor device at a particular stage of manufacture according to different embodiments.

DETAILED DESCRIPTION

Various embodiments of the inventive concept are next described in detail with reference to the accompanying drawings. It is noted that the following description of the different embodiments is merely illustrative in nature, and is not intended to limit the inventive concept, its application, or use. The relative arrangement of the components and steps, and the numerical expressions and the numerical values set forth in these embodiments do not limit the scope of the inventive concept unless otherwise specifically stated. In addition, techniques, methods, and devices as known by those skilled in the art, although omitted in some instances, are intended to be part of the specification where appropriate. It should be noted that for convenience of description, the sizes of the elements in the drawings may not be drawn to scale.

In the drawings, the sizes and/or relative sizes of layers and regions may be exaggerated for clarity. Like reference numerals denote the same elements throughout.

It should be understood that when an element or layer is referred to as "in", "adjacent to", "connected to", or "coupled to" another element or layer, it can be directly on the other element or layer, adjacent, connected or coupled to the other element or layer. In some instances, one or more intervening elements or layers may be present. In contrast, when an element is referred to as being "directly on", "directly adjacent to", "directly connected to", or "directly coupled to" another element or layer, there are no intervening elements present or layer. It will be understood that, although the terms "first," "second," "third," etc. may be used herein to describe various elements, the elements should not be limited by those terms. Instead, those terms are merely used to distinguish one element from another. Thus, a "first" element discussed below could be termed a "second" element without departing from the teachings of the present inventive concept. As used herein, the term "and/or" includes any and all combinations of one or more of the associated listed items.

Spatially relative terms, such as "beneath", "below", "lower", "above", "upper" and the like, may be used herein for ease of description to describe one element or feature's spatial relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments and is not intended to limit the inventive concept. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art, and should not be interpreted in an idealized or overly formal sense unless expressly so defined herein.

Exemplary embodiments are described herein with reference to cross-sectional illustrations that are schematic illustrations of idealized exemplary embodiments (and intermediate structures) of the inventive concept. As such, variations from the shapes of the illustrations as a result of, for example, manufacturing techniques and/or tolerances, are to be expected. Thus, the exemplary embodiments should not be construed as being limited to the particular shapes of regions illustrated herein, but may also include deviations in shapes that result, for example, from manufacturing tolerances. The regions illustrated in the figures are schematic in nature, and their shapes are not intended to illustrate the actual shape of a region of a device, and should not be construed to limit the scope of the inventive concept.

It should be understood that the inventive concept is not limited to the embodiments described herein. Rather, the inventive concept may be modified in different ways to realize different embodiments.

Figure 1A:
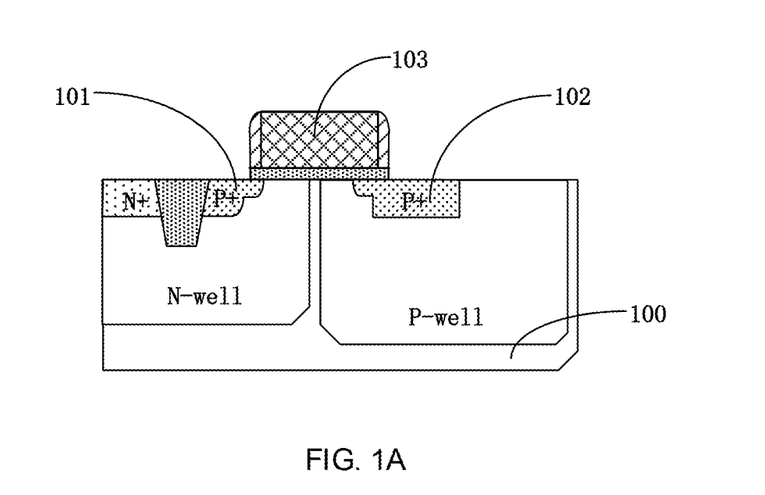
FIG. 1A illustrates a cross-sectional view of a first type of LDMOS.
Figure 1B:
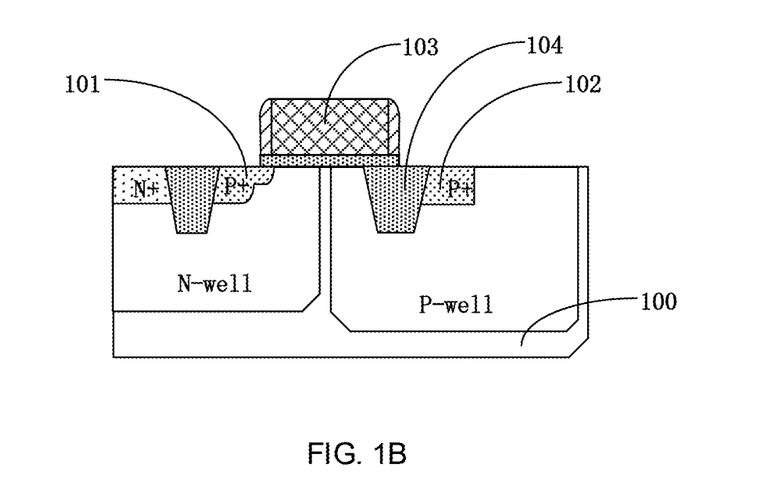
FIG. 1B illustrates a cross-sectional view of a second type of LDMOS.

FIGS. 1A and 1B illustrate two different structures of an LDMOS.

The LDMOS in FIG. 1A includes a semiconductor substrate 100, an N-well and a P-well disposed in the semiconductor substrate 100, a source 101 disposed in the N-well, a drain 102 disposed in the P-well, and a gate 103 disposed on the semiconductor substrate 100. In the example of FIG. 1A, impact ionization may occur at an edge of the drain 102. As such, the LDMOS of FIG. 1A generally has high leakage current and low breakdown voltage.

The LDMOS in FIG. 1B includes a semiconductor substrate 100, an N-well and a P-well disposed in the semiconductor substrate 100, a source 101 disposed in the N-well, a drain 102 disposed in the P-well, and a gate 103 disposed on the semiconductor substrate 100. In addition, the LDMOS in FIG. 1B includes a shallow trench isolation (STI) structure 104 disposed in the P-well. As shown in FIG. 1B, the STI structure 104 is adjacent to an edge of the drain 102 and a portion of the channel. The STI structure 104 can suppress the impact ionization at the edge of the drain 102. However, the presence of the STI structure 104 may increase the length of the drift region, and cause the linear drain current ($I_{d\_lin}$) of the LDMOS to decrease. Although the breakdown voltage is improved in the LDMOS of FIG. 1B, the LDMOS of FIG. 1B is still unable to meet some device performance requirements.

Figure 2A:
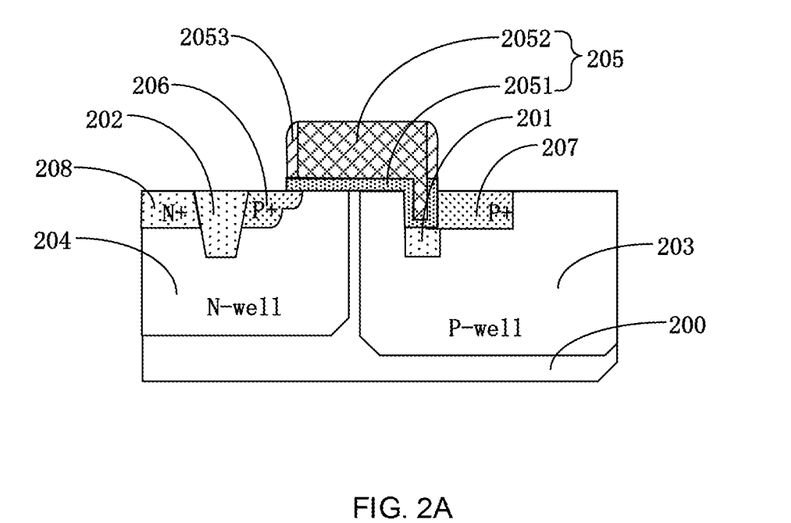
FIG. 2A illustrates a cross-sectional view of a semiconductor device according to an embodiment.

FIG. 2A illustrates a cross-sectional view of a semiconductor device according to an embodiment. The semiconductor device may be an LDMOS. The semiconductor device may also include devices including an LDMOS.

Referring to FIG. 2A, the semiconductor device includes a semiconductor substrate 200, a P-well 203 and an N-well 204 disposed in the semiconductor substrate 100, a shallow trench isolation (STI) structure 201 disposed in the P-well 203, a source 206 disposed in the N-well 204, and a drain 207 disposed in the P-well 203. The semiconductor device further includes a gate structure 205 disposed on the semiconductor substrate 200, with a portion of the gate structure 205 extending into the semiconductor substrate 200. The gate structure 205 includes a gate 2052 and a gate dielectric 2051 disposed below the gate 2052.

The portion of the gate structure 205 extends into a region of the semiconductor substrate 200 corresponding to the location of the STI structure 201. As shown in FIG. 2A, the extended portion of the gate structure 205 is disposed above the STI structure 201.

In one embodiment, a thickness of the extended portion of the gate structure 205 may be the same as a thickness of the STI structure 201. In another embodiment, the thickness of the extended portion of the gate structure 205 may be about half the thickness of the STI structure 201. It should be noted that the thickness of the extended portion of the gate structure 205 may range from about half to the full thickness of the STI structure 201.

In one embodiment, the semiconductor device further includes spacers 2053 disposed on opposite sides of the gate structure 205.

In one embodiment, the semiconductor device further includes an electrode 208 disposed in the N-well 204.

In one embodiment, the semiconductor device may further include an STI structure 202 disposed in the N-well 204. The STI structure 202 serves to isolate the electrode 208 from the source 206.

Figure 2B:
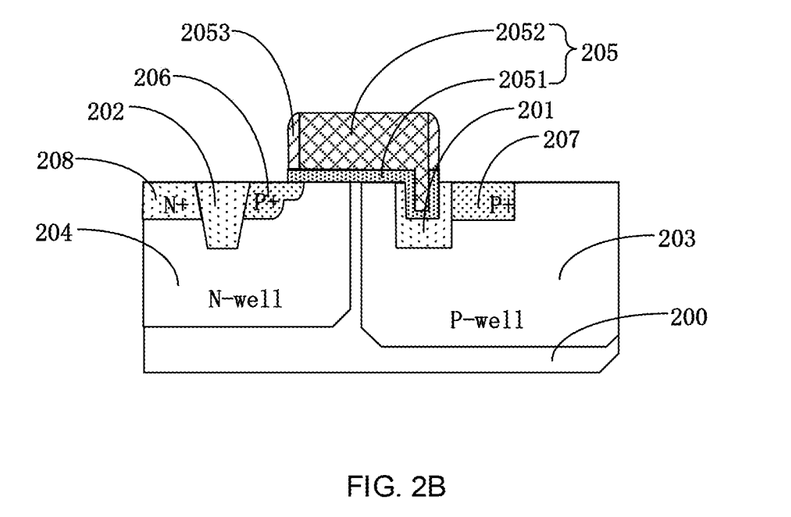
FIG. 2B illustrates a cross-sectional view of a semiconductor device according to another embodiment.

FIG. 2B illustrates a cross-sectional view of a semiconductor device according to another embodiment. The embodiment of FIG. 2B is similar to the embodiment of FIG. 2A except for the following difference. In the embodiment of FIG. 2B, the portion of the gate structure 205 extending into the semiconductor substrate 200 is disposed in a recess in the STI structure 201.

The semiconductor substrate 200 may be a monocrystalline silicon substrate, a silicon-on-insulator (SOI) substrate, or any other suitable substrate. The STI structures 201 and 202 may include silicon oxide or other suitable materials. The gate 2052 may include polysilicon or metals. The gate dielectric 2051 and the spacers 2053 may include materials such as silicon oxide. In one embodiment, the gate dielectric 2051 and the STI structure 202 are made of a same material, for example, silicon oxide.

The STI structure 201 can suppress impact ionization at the edge of the drain 207, thereby improving the performance of the semiconductor device.

In the semiconductor device of FIGS. 2A and 2B, since a portion of the gate structure 205 extends into the semiconductor substrate 200, a length of the gate structure 205 will be greater than a length of a corresponding gate in the prior art. The increased length allows the gate structure 205 to have greater control over the channel of the semiconductor device, and ensures that the semiconductor device has a large linear drain current ($I_{d\_lin}$) without a reduction in the breakdown voltage.

Experimental results have shown that when the LDMOS of FIGS. 1A/1B and the semiconductor device of FIGS. 2A/2B are subject to the same breakdown voltage, the semiconductor device of FIGS. 2A/2B has a greater $I_{d\_lin}$ compared to the LDMOS of FIGS. 1A/1B.

Accordingly, the exemplary semiconductor device of FIGS. 2A and 2B has a higher breakdown voltage and improved device performance.

Figure 3A:
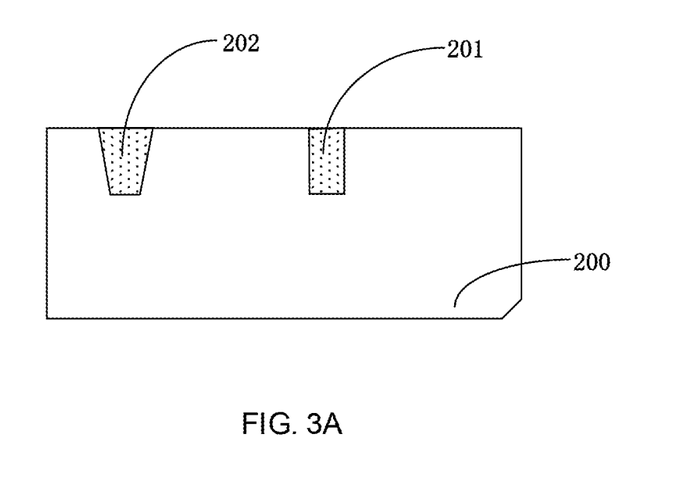
FIGS. 3A, 3B, 3C, 3D, and 3E depict schematic views of a semiconductor device at different stages of manufacture according to an exemplary method of manufacturing the semiconductor device.

Next, a method of manufacturing a semiconductor device according to an embodiment will be described in detail with reference to FIGS. 3A though 3E. Specifically, FIGS. 3A though 3E depict schematic views of the semiconductor device at different stages of manufacture.

The semiconductor device may be an LDMOS. The semiconductor device may also include devices including an LDMOS.

The method includes the following steps.

In Step A1, a semiconductor substrate 200 is provided. A shallow trench isolation (STI) structure 201 is formed in the semiconductor substrate 200, as shown in FIG. 3A. The STI structure 201 is disposed in a location corresponding to where a P-well is to be formed.

In one embodiment, a STI structure 202 may also be formed in the semiconductor substrate 200. The STI structure 202 is disposed in a location corresponding to where an N-well is to be formed.

In some particular embodiments, the STI structure 202 may be omitted.

The semiconductor substrate 200 may be a monocrystalline silicon substrate, a silicon-on-insulator (SOI) substrate, or any other suitable substrate. The STI structures 201 and 202 may include silicon oxide or other suitable materials.

In one embodiment, forming the STI structure 201 may further include the following steps.

First, a trench is formed by etching a portion of the semiconductor substrate 200. Next, the trench is filled with a dielectric material. Excess dielectric material is then removed by chemical mechanical polishing (CMP), thereby forming the STI structure 201.

Figure 3B:
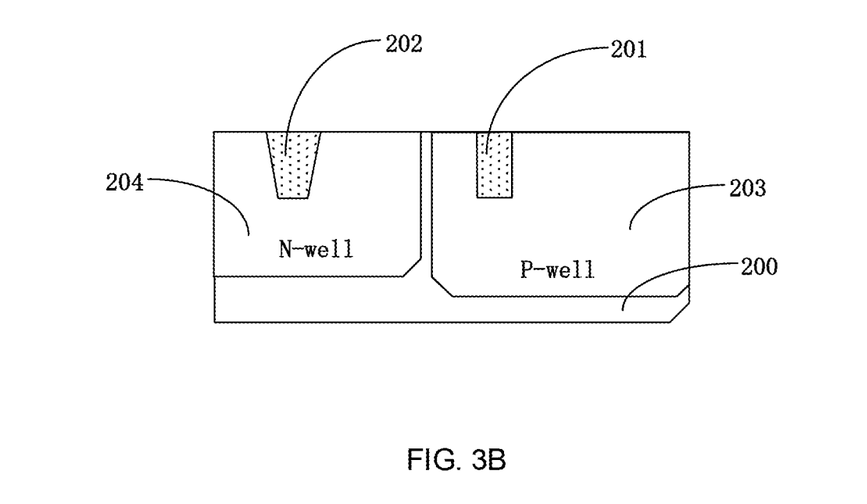

In Step A2, ion implantation is performed to form a P-well 203 and an N-well 204 in the semiconductor substrate 200. Specifically, the STI structure 201 is disposed in the P-well 203, with the P-well 203 surrounding the side and bottom portions of the STI structure 201. The resulting structure formed after Step A2 is shown in FIG. 3B.

The P-well 203 and the N-well 204 serve to accommodate the source and drain of the LDMOS, respectively, and are arranged adjacent to each other. In one embodiment, the P-well 203 may be formed prior to forming the N-well 204. In another embodiment, the N-well 204 may be formed prior to forming the P-well 203. The ions for the ion implantation in Step A2 may be selected based on device requirements.

If the STI structure 202 is formed in Step A1, the STI structure 202 will be disposed in the N-well 204, with the N-well 204 surrounding the side and bottom portions of the STI structure 202.

Figure 3C:
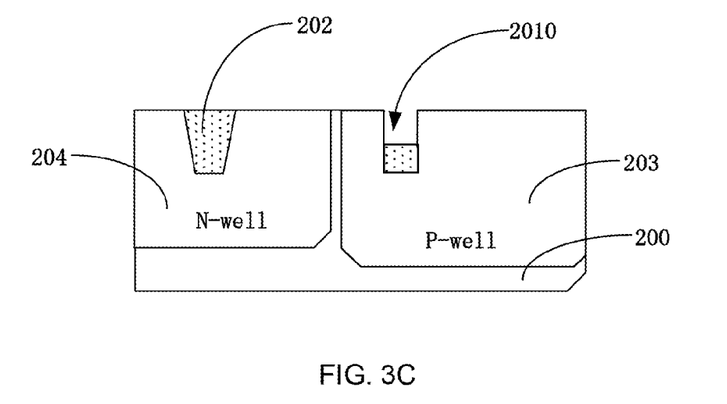

In Step A3, a recess 2010 is formed by etching a portion of the STI structure 201, as shown in FIG. 3C. The etched portion of the STI structure 201 has a predetermined thickness. The predetermined thickness may range from about one-third to about half of the thickness of the original (un-etched) STI structure 201. As shown in FIG. 3C, the recess 2010 is disposed above the remaining STI structure 201.

Figure 3C:
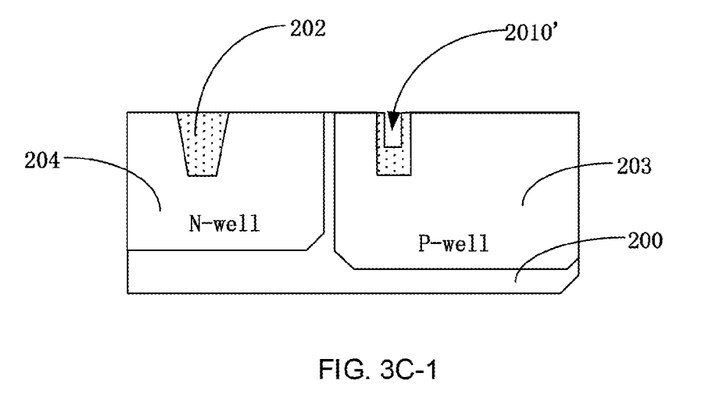

The recess 2010 may be formed in different configurations. For example, in FIG. 3C-1, a recess 2010' is formed by etching a portion of the STI structure 201. In the example of FIG. 3C-1, the recess 2010' is formed within the STI structure 201, and does not expose any inner sidewall of the P-well 203.

Figure 3C:
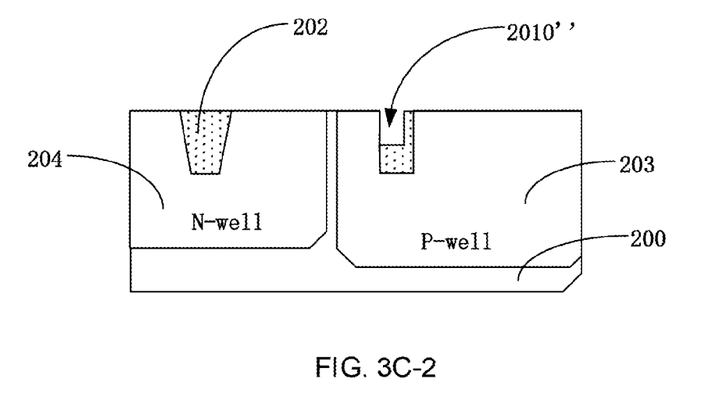

In another example, a recess 2010" is formed by etching a side portion of the STI structure 201, as shown in FIG. 3C-2. In the example of FIG. 3C-2, the recess 2010" exposes an inner sidewall of the P-well 203. In contrast, the recess 2010 in the example of FIG. 3C exposes two inner opposite sidewalls of the P-well 203.

In one embodiment, a depth of the recess 2010 is less than a thickness of the remaining STI structure 201 after the STI structure 201 has been etched.

The STI structure 201 may be etched using dry etching, wet etching, or any other suitable etching method.

Figure 3D:
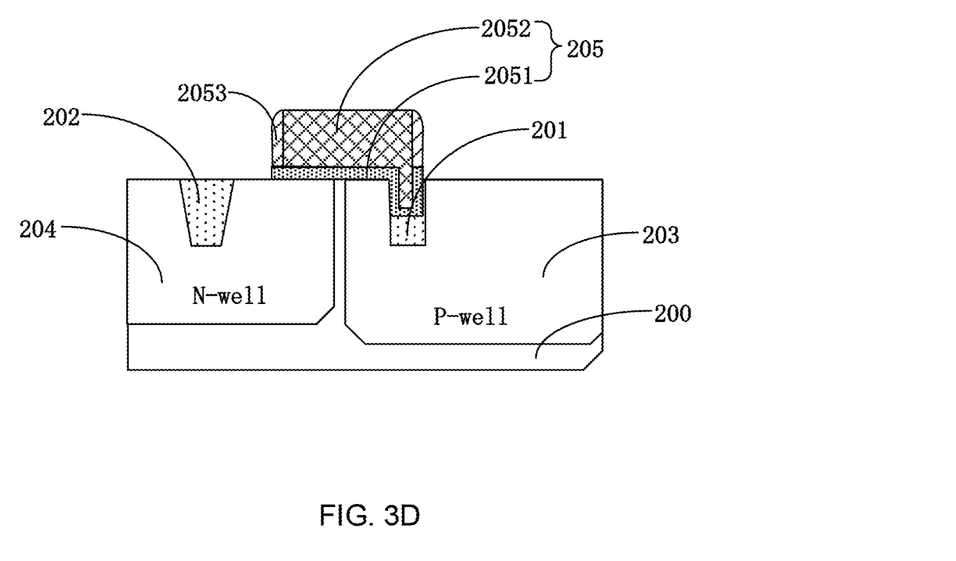

In Step A4, a gate structure 205 is formed on the semiconductor substrate 200. A portion of the gate structure 205 extends into the recess 2010, as shown in FIG. 3D. The gate structure 205 includes a gate 2052 and a gate dielectric 2051 disposed below the gate 2052.

In one embodiment, Step A4 further includes Steps A41 and A42, described below.

In Step A41, the gate dielectric 2051 is formed on the semiconductor substrate 200, with a portion of the gate dielectric 2051 extending into the recess 2010.

In Step A42, the gate 2052 is formed on top of the gate dielectric 2051, with a portion of the gate 2052 extending into the recess 2010.

As shown in FIG. 3D, the gate dielectric 2051 is formed on a portion of the semiconductor substrate 200, and on the sidewalls and bottom surface of the recess 2010. The gate dielectric 2051 may be formed using methods known to those skilled in the art. For example, the gate dielectric 2051 may be formed by depositing and etching a dielectric material. The gate dielectric layer 2051 may include materials such as silicon oxide.

The gate 2052 may be formed using methods known to those skilled in the art. For example, the gate 2052 may be formed by depositing and etching polysilicon. In another embodiment, the gate 2052 may include metals.

In Step A4, spacers 2053 may be formed on opposite sidewalls of the gate 2052 after the gate 2052 has been formed, as shown in FIG. 3D. The spacers 2053 may include silicon oxide or other suitable materials. In one embodiment, the gate dielectric 2051 and the STI structure 202 may be made of a same material, for example, silicon oxide.

In the above embodiment, since the gate structure 205 includes a portion extending into the recess 2010, a length of the gate structure 205 will be greater than a length of a corresponding gate in the prior art. The increased length allows the gate structure 205 to have greater control over the channel of the semiconductor device, and ensures that the semiconductor device has a large linear drain current ($I_{d\_lin}$) without a reduction in the breakdown voltage.

Accordingly, the semiconductor device formed using the above method has a higher breakdown voltage and improved device performance.

Figure 3E:
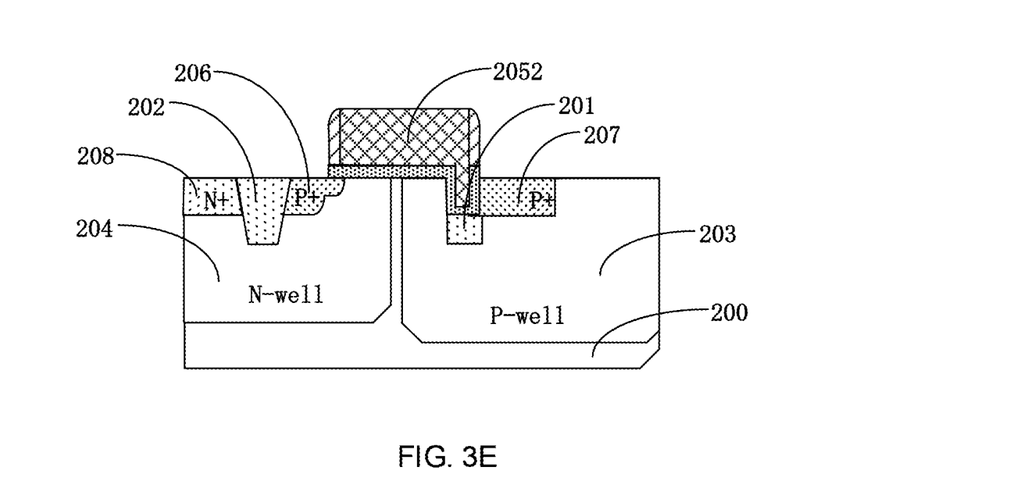

In Step A5, ion implantation is performed to form a source 206 in the N-well 204 and a drain 207 in the P-well 203, as shown in FIG. 3E.

In one embodiment, the implanted ions may include $P^+$ ions.

In one embodiment, ion implantation may also be used to form an electrode 208 in the N-well 204. As shown in FIG. 3E, the electrode 208 and the source 206 are formed on opposite sides of the STI structure 202. In one embodiment, the implanted ions for forming the electrode 208 may be $N^+$ ions.

It should be noted that the ion types for the ion implantation can be selected based on device requirements, and need not be limited to those described above.

In one embodiment, the source 206 and the drain 207 may be formed in a same ion implantation step. In one embodiment, the source 206 and the drain 207 may be formed prior to forming the electrode 208. In another embodiment, the electrode 208 may be formed prior to forming the source 206 and the drain 207.

A method of forming a semiconductor device according to an embodiment has been described above in Steps A1 through A5. In some embodiments, other processing steps may be added after Step A5.

In the above exemplary method, the recess 2010 is formed by etching a portion of the STI structure 201. The gate structure 205 is then formed on the semiconductor substrate 200, with a portion of the gate structure 205 extending into the recess 2010. As a result, a length of the gate structure 205 will be greater than a length of a corresponding gate in the prior art. The increased length allows the gate structure 205 to have greater control over the channel of the semiconductor device, and ensures that the semiconductor device has a large linear drain current ($I_{d\_lin}$) without a reduction in the breakdown voltage. Accordingly, the semiconductor device formed using the above method has a higher breakdown voltage and improved device performance.

Figure 4:
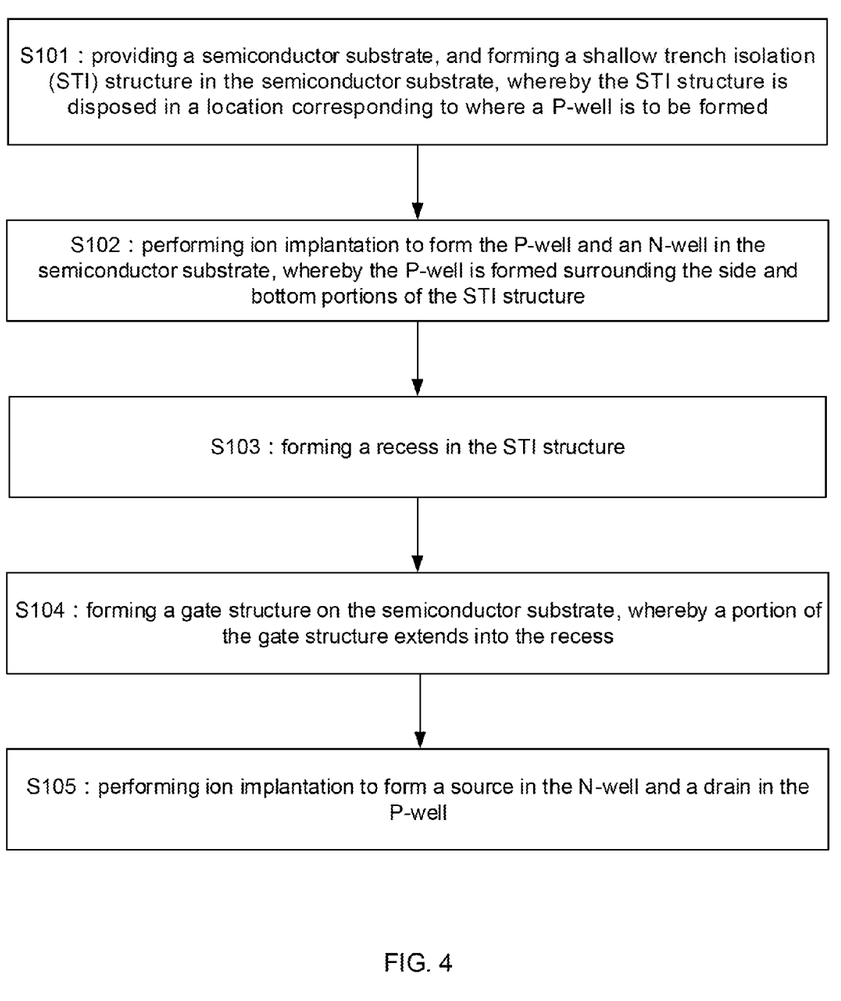
FIG. 4 is a flowchart illustrating a method of manufacturing a semiconductor device according to an embodiment.

FIG. 4 is a flowchart illustrating a method of manufacturing a semiconductor device according to an embodiment. The method of FIG. 4 may include some or all of the previously-described Steps A1 through A5 including their sub-steps. Specifically, the method of FIG. 4 includes the following steps.

Step S101: providing a semiconductor substrate, and forming a shallow trench isolation (STI) structure in the semiconductor substrate, whereby the STI structure is disposed in a location corresponding to where a P-well is to be formed.

Step S102: performing ion implantation to form the P-well and an N-well in the semiconductor substrate, whereby the P-well is formed surrounding the side and bottom portions of the STI structure.

Step S103: forming a recess in the STI structure.

Step S104: forming a gate structure on the semiconductor substrate, whereby a portion of the gate structure extends into the recess.

Step S105: performing ion implantation to form a source in the N-well and a drain in the P-well.

A semiconductor device according to the embodiments of FIG. 2A or 2B, or a semiconductor device manufactured using the method of FIG. 4, may be incorporated into an electronic apparatus. As previously mentioned, the exemplary semiconductor device has a higher breakdown voltage and improved device performance compared to existing devices. Therefore, the electronic apparatus including the exemplary semiconductor device would inherit the above desirable characteristics. The exemplary semiconductor device can be formed on an integrated circuit that is then incorporated into the electronic apparatus. The electronic apparatus may include mobile phones, tablet PCs, laptops, netbooks, game consoles, TVs, VCD players, DVD players, navigation systems, cameras, video cameras, voice recorders, MP3/MP4 players, PSPs, and any other electronic products or devices. The electronic apparatus may also include intermediate (unfinished) products comprising the exemplary semiconductor device.

Embodiments of a semiconductor device and a method of forming the semiconductor device have been described in the foregoing description. To avoid obscuring the inventive concept, details that are well-known in the art may have been omitted. Nevertheless, those skilled in the art would be able to understand the implementation of the inventive concept and its technical details in view of the present disclosure.

The different embodiments of the inventive concept have been described with reference to the accompanying drawings. However, the different embodiments are merely illustrative and are not intended to limit the scope of the inventive concept. Furthermore, those skilled in the art would appreciate that various modifications can be made to the different embodiments without departing from the scope of the inventive concept.

What is claimed is:

1. A semiconductor device comprising:
a semiconductor substrate;
a P-well and an N-well disposed in the semiconductor substrate;
a source disposed in the N-well and a drain disposed in the P-well;
a shallow trench isolation (STI) structure disposed in the P-well;
a gate structure disposed on the semiconductor substrate, wherein a portion of the gate structure extends into the semiconductor substrate and is disposed in a location corresponding to the STI structure.

2. The semiconductor device according to claim 1, further comprising:
spacers disposed on opposite sides of the gate structure.

3. The semiconductor device according to claim 1, further comprising:
an electrode disposed in the N-well.

4. The semiconductor device according to claim 1, wherein the portion of the gate structure extending into the semiconductor substrate is disposed directly above the STI structure.

5. The semiconductor device according to claim 4, wherein a thickness of the portion of the gate structure extending into the semiconductor substrate ranges from about half to a full thickness of the STI structure.

6. The semiconductor device according to claim 1, wherein the portion of the gate structure extending into the semiconductor substrate is disposed in a recess in the STI structure.

7. The semiconductor device according to claim 6, wherein the recess is disposed within the STI structure without exposing any inner sidewall of the P-well.

8. The semiconductor device according to claim 6, wherein the recess exposes at least one inner sidewall of the P-well.

9. The semiconductor device according to claim 8, wherein the recess exposes two inner opposite sidewalls of the P-well.

* * * * *